(12) United States Patent
Zhao et al.

(10) Patent No.: US 11,218,020 B2
(45) Date of Patent: Jan. 4, 2022

(54) DEVICE FOR DETECTING THE LOAD STATE OF DRIVING POWER SUPPLY

(71) Applicants: Self Electronics Co., Ltd., Zhejiang (CN); Wanjiong Lin, Zhejiang (CN); Self electronics USA Corporation, Norcross, GA (US)

(72) Inventors: Pengyuan Zhao, Zhejiang (CN); Xiaobo You, Zhejiang (CN)

(73) Assignee: Self Electronics Co., Ltd., Ningbo (CN)

( * ) Notice: Subject to any disclaimer, the term of this patent is extended or adjusted under 35 U.S.C. 154(b) by 55 days.

(21) Appl. No.: 16/690,971

(22) Filed: Nov. 21, 2019

(65) Prior Publication Data

US 2020/0169112 A1 May 28, 2020

(30) Foreign Application Priority Data

Nov. 28, 2018 (CN) .......................... 201811433507.0

(51) Int. Cl.
*H02J 9/00* (2006.01)
*H02M 3/07* (2006.01)

(52) U.S. Cl.
CPC ............... *H02J 9/005* (2013.01); *H02M 3/07* (2013.01)

(58) Field of Classification Search
CPC ............. H02J 9/005; H02M 3/06; H02M 3/07
USPC .......................................................... 307/64
See application file for complete search history.

(56) References Cited

U.S. PATENT DOCUMENTS

2013/0162150 A1* 6/2013 Masuda ............... H05B 45/375
315/186

* cited by examiner

*Primary Examiner* — Hal Kaplan
(74) *Attorney, Agent, or Firm* — Wang Law Firm, Inc.

(57) ABSTRACT

The invention discloses a device for detecting load state of driving power supply, the present invention can detect the load state of the driving power supply by using the parasitic capacitance, the pull-down resistor module inside the main control unit and the level detecting module in the circuit, without adding peripheral circuit. In this way, the actual product volume of the present invention does not increase, nor does it need to increase the hardware cost.

4 Claims, 2 Drawing Sheets

DEVICE FOR DETECTING THE LOAD STATE OF DRIVING POWER SUPPLY

RELATED APPLICATION

This application claims priority to a Chinese Patent Application No. CN 201811433507.0, filed on Nov. 28, 2018.

FIELD OF THE TECHNOLOGY

The present invention relates to electronic equipment field, with particular emphasis on a device for detecting the load state of driving power supply.

BACKGROUND OF THE INVENTION

The load is an important part of the external circuit system or the internal circuit system of electronic equipment. The real-time detection of the load working state and the timely detection and processing of the load fault are prerequisites for the stable operation of the circuit system. The existing load state detecting devices usually use dc reference power supply, sensors or amplifiers, etc., which is high in cost and difficult for the circuit design.

For electronic equipment, when multiple loads in the internal circuit system of the equipment need to be detected, the peripheral circuit will occupy more space, leading to the increase of actual product volume, which increases the product cost in a disguised way, and is not conducive to the miniaturization and integration of the product.

BRIEF SUMMARY OF THE INVENTION

In view of the above, it is necessary to provide a device for detecting the load state of driving power supply to overcome the above disadvantages.

a device for detecting load state of driving power supply, comprising driving power supply, load, first resistor, second resistor, and main control unit; the load, the first resistor and the second resistor are connected in series and connected to the driving power supply; and one end of the second resistor is grounded, the main control unit is provided with an input/output interface, a switchable pull-down resistor module, a level detecting module and a control module; the input/output interface is connected to the common end of the first resistor and the second resistor; the level detecting module is configured to detect the level of the input/output interface, and the high potential end of the pull-down resistor module is connected to the input/output interface; the low potential end of the pull-down resistor module is grounded, and the control module is connected to the control end of the pull-down resistor module; a parasitic capacitance is generated on the circuit between the input/output interface and the common end of the first resistor and the second resistor.

A method for detecting load state of driving power supply comprising:

the driving power supply supplies power to the load;

the pull-down resistor module in the main control unit is turned off;

the main control unit starts timing, and the level detecting module starts detecting the level of the input/output interface; If the level detecting module detects that the level on the input/output interface reaches the expected value in the process of timing, it is determined that the driving power supply is in a normal load state at this time; if the level detecting module does not detect that the level on the input/output interface reaches the expected value after the timing is completed, it is determined that the driving power supply is in a no-load state at this time.

Turn on the pull-down resistor module in the main control unit.

Compared with the prior art, the present invention can detect the load state of the driving power supply by using the parasitic capacitance, the pull-down resistor module inside the main control unit and the level detecting module in the circuit, without adding peripheral circuit. In this way, the actual product volume of the present invention does not increase, nor does it need to increase the hardware cost, and the present invention also has a clamping effect on the input/output interface of the main control unit. When a high voltage is detected, the main control unit turns on the pull-down resistance module. The pull-down resistance module is in parallel with the second resistor to divide the voltage, so that a lower level enters the main control unit, which acts as a clamp. so that no clamp diode is required in the circuit, thereby saving components and reducing hardware costs.

BRIEF DESCRIPTION OF THE DRAWINGS

The drawings described herein are intended to promote a further understanding of the present invention, as follows.

DETAILED DESCRIPTION OF THE INVENTION the present application is illustrated by way of the following detailed description based on of the accompanying drawings. It should be noted that illustration to the embodiment in this application is not intended to limit the invention.

Figure 1:
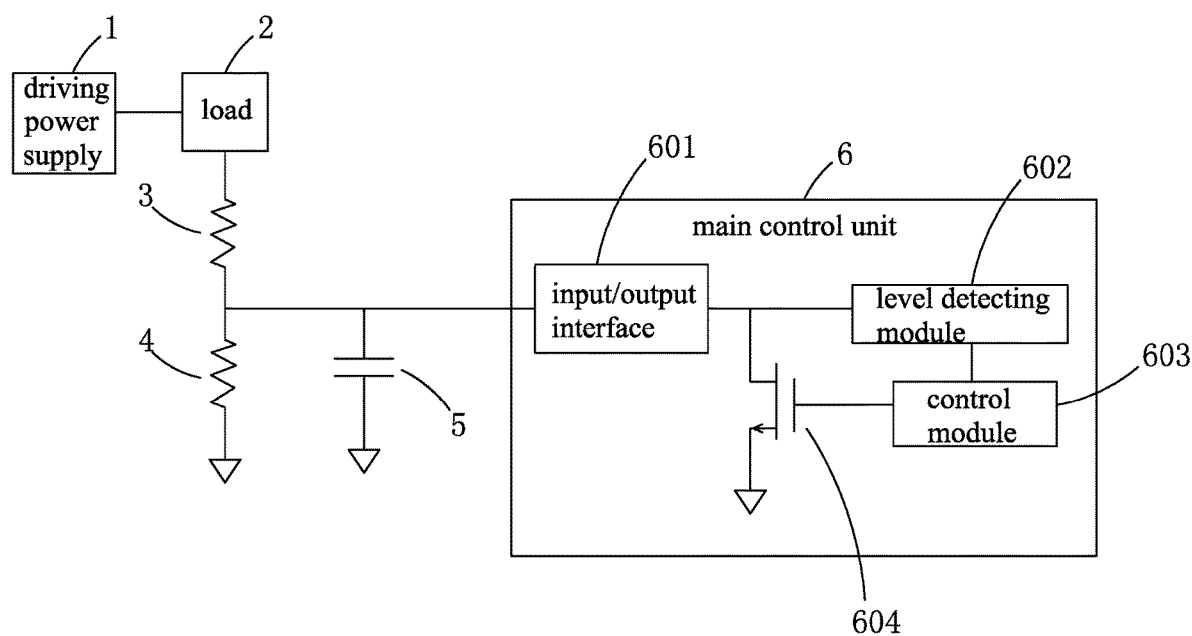
FIG. 1 is a circuit block diagram of the present invention.
Figure 2:
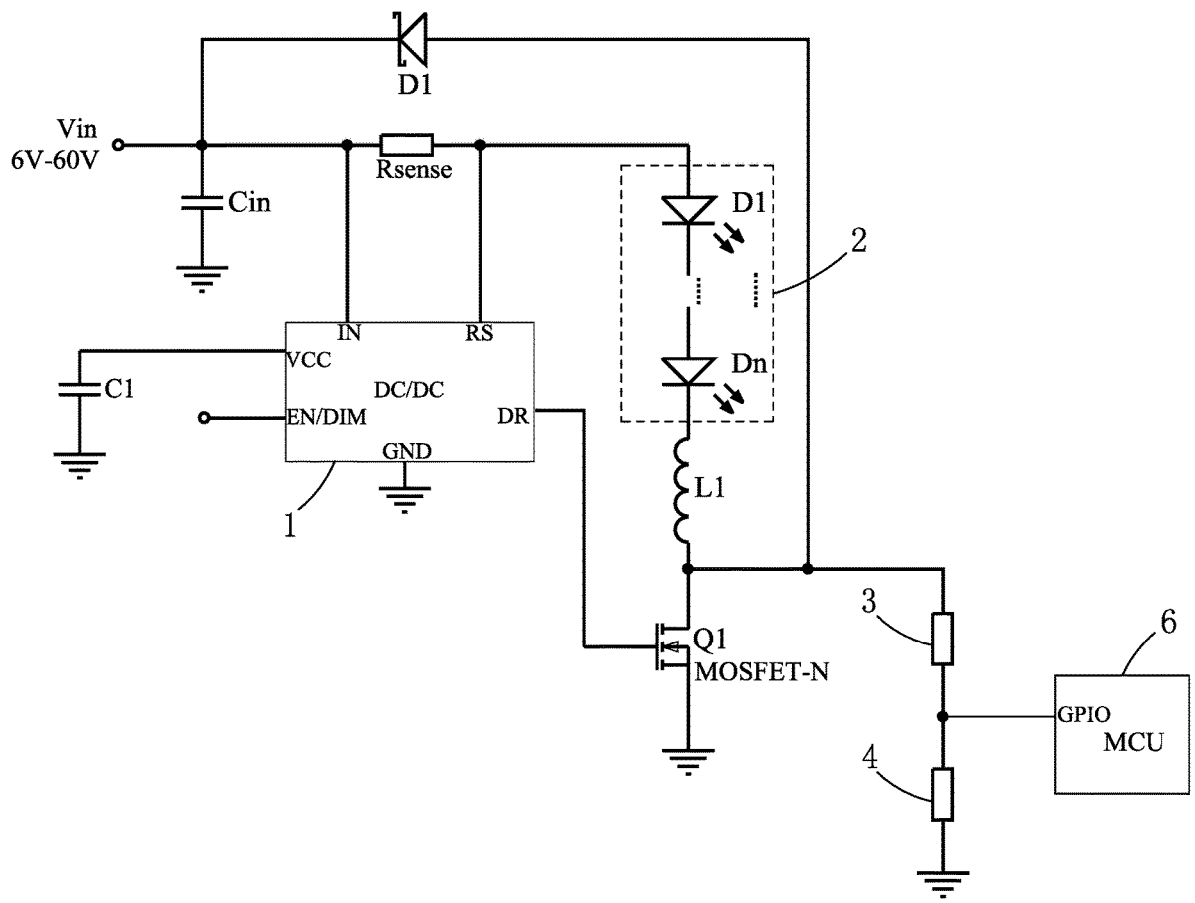
FIG. 2 is a schematic diagram of the circuit of the present invention.

As shown in FIG. 1 and FIG. 2, the device for detecting the load state of driving power supply of this embodiment comprises driving power supply 1, load 2, first resistor 3, second resistor 4, and main control unit 6. The load 2 is composed of a plurality of LEDs connected in series, and the main control unit 6 is a microcontroller. The load 2, the first resistor 3 and the second resistor 4 are connected in series and connected to the driving power supply 1. The driving power supply 1 is used to supply power to the load 2, and one end of the second resistor 4 is grounded. In this embodiment, the resistance values of the first resistor 3 and the second resistor 4 are both 5.1 M.

The main control unit 6 is provided with an input/output interface 601, a switchable pull-down resistor module 604, a level detecting module 602 and a control module 603. The input/output interface 601 is a general-purpose input/output interface GPIO. The input/output interface 601 is connected to the common end of the first resistor 3 and the second resistor 4. The level detecting module 602 is configured to detect the level of the input/output interface 601, and the high potential end of the pull-down resistor module 604 is connected to the input/output interface 601. The low potential end of the pull-down resistor module 604 is grounded, and the control module 603 is connected to the control end of the pull-down resistor module 604.

a parasitic capacitance 5 is generated on the circuit between the input/output interface 601 and the common end of the first resistor 3 and the second resistor 4.

the pull-down resistor module 604 is a MOS transistor, the gate electrode of the MOS transistor is connected to the control module 603, the drain electrode of the MOS transistor is connected to the input/output interface, and the source electrode of the MOS transistor is grounded.

The resistance value of the pull-down resistor module 604 is between 10 and 100 kΩ.

The embodiment further discloses a method for detecting the load state of driving power supply, comprising the following steps:

S1: the driving power supply supplies power to the load. At this time, the default is that the whole circuit is in normal working state and the pull-down resistor in the main control unit is in an open state, that is, the MOS transistor in the main control unit is in an on state.

S2: the pull-down resistor module in the main control unit is turned off, that is, the signal is sent to the gate electrode of the MOS transistor through the control module, so that the MOS transistor is turned off.

S3: the main control unit starts timing, and the level detecting module starts detecting the level of the input/output interface, and the timing time can be set according to different types of electronic components. In this embodiment, the timing time is 10 ms. If the level detecting module detects that the level on the input/output interface reaches the expected value in the process of timing, it is determined that the driving power supply is in a normal load state at this time; if the level detecting module does not detect that the level on the input/output interface reaches the expected value after the timing is completed, it is determined that the driving power supply is in a no-load state at this time.

The determining principle here is: after the pull-down resistor module in the main control unit is turned off, since there is parasitic capacitance in the circuit between the input/output interface and the common end of the first resistor and the second resistor, if the load in the circuit is normal, the level on the input/output interface will gradually rise, and the level will rise to the expected value in the timekeeping time. If there is no load in the circuit, the level on the input/output interface cannot rise to the expected value within the timekeeping time.

S4: Turn on the pull-down resistor module in the main control unit; that is to say, send signals through the control module to the gate electrode of the MOS transistor to make the MOS transistor conduct. At this time, the pull-down resistor module is in parallel with the second resistor to divide the voltage, so that a lower level enters the main control unit to play the role of clamping.

The above disclosure has been described by way of example and in terms of exemplary embodiment, and it is to be understood that the disclosure is not limited thereto. Rather, any modifications, equivalent alternatives or improvement etc. within the spirit of the invention are encompassed within the scope of the invention as set forth in the appended claims.

What is claimed is:

1. A device for detecting load state of driving power supply, comprising:
   driving power supply (1);
   load (2);
   first resistor (3);
   second resistor (4);
   and main control unit (6);
   the load (2), the first resistor (3) and the second resistor (4) are connected in series and connected to the driving power supply (1); and one end of the second resistor (4) is grounded, the main control unit (6) is provided with an input/output interface (601), a switchable pull-down resistor module (604), a level detecting module (602) and a control module (603); the input/output interface (601) is connected to the common end of the first resistor (3) and the second resistor (4); the level detecting module (602) is configured to detect the level of the input/output interface (601), and the high potential end of the pull-down resistor module (604) is connected to the input/output interface (601); the low potential end of the pull-down resistor module (604) is grounded, and the control module (603) is connected to the control end of the pull-down resistor module (604); a parasitic capacitance (5) is generated on the circuit between the input/output interface (601) and the common end of the first resistor (3) and the second resistor (4).

2. The device for detecting load state of driving power supply as claimed in claim 1, wherein the pull-down resistor module (604) is a MOS transistor.

3. A method for detecting load state of driving power supply using the device as claimed in claim 1, comprising:
   supplying, by the driving power supply, power to the load;
   turning off the pull-down resistor module in the main control unit;
   starting timing using the main control unit, and
   starting detection, using the level detecting module, of the level of the input/output interface;
   if the level detecting module detects that the level on the input/output interface reaches an expected value in a process of timing, determining that the driving power supply is in a normal load state at this time; if the level detecting module does not detect that the level on the input/output interface reaches the expected value after the process of timing is completed, determining that the driving power supply is in a no-load state at this time;
   turning on the pull-down resistor module in the main control unit.

4. The method for detecting load state of driving power supply as claimed in claim 3, wherein a timing time of the main control unit is 10 ms.

* * * * *